United States Patent [19]

Tomizawa et al.

[11] Patent Number: 4,664,742

[45] Date of Patent: May 12, 1987

[54] METHOD FOR GROWING SINGLE CRYSTALS OF DISSOCIATIVE COMPOUNDS

[75] Inventors: Kenji Tomizawa, 1-380-38, Yoshinocho, Ohmiya-shi, Saitama; Yasushi Shimanuki, 399-16, Kawashima, Hasuda-shi, Saitama; Koichi Sassa, Fuchu, all of Japan

[73] Assignees: Kenji Tomizawa, Ohmiya; Yasushi Shimanuki, Hasudi; Research Development Corporation of Japan, Tokyo, all of Japan

[21] Appl. No.: 735,395

[22] Filed: May 17, 1985

[30] Foreign Application Priority Data

May 25, 1984 [JP] Japan .................................. 59-104438

[51] Int. Cl.⁴ ............................................. C30B 27/02
[52] U.S. Cl. .............................. 156/607; 156/617 SP; 156/DIG. 83; 156/DIG. 89; 156/DIG. 93; 422/249
[58] Field of Search ......... 156/607, 617 SP, DIG. 70, 156/DIG. 81, DIG. 83, DIG. 89, DIG. 93; 422/249

[56] References Cited

U.S. PATENT DOCUMENTS

| 3,088,853 | 5/1963 | Harper | 156/DIG. 93 |
| 3,198,606 | 8/1965 | Lyons | 422/249 |
| 3,716,345 | 2/1973 | Grabmaier | 156/617 SP |
| 3,741,817 | 6/1973 | Bienert et al. | 156/607 X |
| 4,036,595 | 7/1977 | Lorenzini et al. | 422/249 |
| 4,203,951 | 5/1980 | Goriletsky et al. | 422/249 |
| 4,431,476 | 2/1984 | Watanabe et al. | 156/607 |
| 4,496,424 | 1/1985 | Terashima et al. | 156/607 X |

FOREIGN PATENT DOCUMENTS

| 159113 | 10/1985 | European Pat. Off. |  |
| 1934369 | 1/1971 | Fed. Rep. of Germany |  |
| 2245250 | 3/1974 | Fed. Rep. of Germany |  |
| 996008 | 6/1965 | United Kingdom | 156/607 |

Primary Examiner—David L. Lacey
Assistant Examiner—M. Gzybowski
Attorney, Agent, or Firm—Flynn, Thiel, Boutell & Tanis

[57] ABSTRACT

The present invention provides a method for growing single crystals of a dissociative compound by pulling with a volatile component gas of the dissociative compound sealed at a controlled pressure in a heated growth chamber in which the single crystals are pulled, wherein a partition pipe having a lower density than the density of melt of the dissociative compound is disposed so as to immerse its lower end in the melt and the melt is covered with $B_2O_3$ at either one of the inside or outside of the partition pipe. The method of the present invention enables the precise, appropriate control of the melt composition during the course of growing and thereby provides single crystals free from any detrimental contamination and undesirable dislocation problems. The thus obtained crystals are especially desirable for use as substrates for high speed and/or optical devices, because of their excellent semi-insulating properties.

7 Claims, 3 Drawing Figures

METHOD FOR GROWING SINGLE CRYSTALS OF DISSOCIATIVE COMPOUNDS

BACKGROUND OF THE INVENTION

The present invention relates to a method for growing single crystals of dissociative compounds which are especially suitable for the production of substrates for both high speed and/or optical devices.

Conventionally, highly dissociative compound semiconductors, such as GaAs single crystal, are produced by the Horizontal Bridgeman method (hereinafter referred to as the HB method) or by the Liquid Encapsulated Czochralski method (hereinafter referred to as the LEC method). These conventional methods, however, have the following disadvantages and cannot sufficiently meet the following requirements. For instance, round semi-insulating (100) wafers which are free from dislocations and have a high purity and a uniform resistance are desired for use in IC substrates. However, the HB method is disadvantageous in that since an ingot with a <111> direction is grown in a quartz boat, the ingot must be cut into wafers at an angle of 54.7° with respect to the growing direction of the crystal and then the wafers must be cut out into a round shape, when the semi-insulating wafers are requested. A further disadvantage is in that it is difficult to grow a single crystal with a high purity due to the contamination of Si from the quartz boat, as compared to the LEC method.

On the other hand, the LEC method is advantageous in that crystal growth in a <100> direction can be readily achieved and since $B_2O_3$ covering the surface of GaAs melt acts as a getter for depriving Si contained in the melt, it is easy to grow single crystals with a high purity. It has been recognized that in order to obtain semi-insulating crystals, it is very important to maintain the GaAs melt in a proper composition. However, in the conventional LEC method, it is very difficult to precisely control the composition of the melt placed below the $B_2O_3$ layer during the course of growing and an unfavorable reduction in resistance is apt to occur due to an unwanted compositional change in the melt. For this reason, it is highly desirable to develop an improved method for controlling precisely the composition of the melt throughout the growing process whilst retaining the ability of $B_2O_3$ as a getter.

As an improvement of the LEC method, a new method and apparatus for growing crystals in an arsenic atmosphere has been proposed in Japanese patent laid-open No. 55-80796.

The new method has an advantage that it is possible to provide a wafer having a crystal defect density reduced to the same or lower level as compared with the HB method, but disadvantageously the method cannot successfully control the composition of the GaAs melt during the course of growing process, as in the case of the usual LEC method, because As cannot enter the melt through a $B_2O_3$ layer.

SUMMARY OF THE INVENTION

It is therefore an object of the present invention to eliminate the above disadvantages encountered in the prior art, and particularly to provide a method for growing single crystals of a dissociative compound wherein melt of the dissociative compound, such as GaAs, is partially sealed with a $B_2O_3$ layer and is maintained in an appropriate composition by controlling the pressure of a volatile component gas contained in a sealed growth chamber. The $B_2O_3$ layer covers, for example, the central or peripheral portion of the melt surface, but not the entire surface of the melt, whereby As is allowed to enter the melt.

According to the present invention, there is provided a method for growing single crystals of a dissociative compound with a volatile component gas sealed at a controlled pressure in a heated growth chamber in which the single crystals are pulled, wherein a partition pipe having a smaller density than the density of the melt of the dissociative compound is disposed so as to immerse its lower end in the melt and the melt is covered with $B_2O_3$ either in the inside or in the outside of the partition pipe.

By the method of the present invention, the melt composition of the source material can be precisely controlled and thereby the aimed single crystals can be readily obtained without any detrimental contamination and dislocation problems. The crystals grown by the method of the present invention have satisfactory semi-insulating properties which render them especially desirable for use as substrates of high seal and/or optical devices, in which the previously mentioned difficulties experienced in the LEC method commonly practiced can be successfully overcome while retaining the advantages of the same method.

BRIEF DESCRIPTION OF THE DRAWINGS

By way of preferred embodiments and to make the description more clear, reference is made to the accompanying drawings in which.

DETAILED DESCRIPTION OF THE PREFERRED EMBODIMENTS

An apparatus used for the growth of single GaAs crystals will be now described in detail, by way of example only, with reference to the accompanying drawings.

Figure 1:
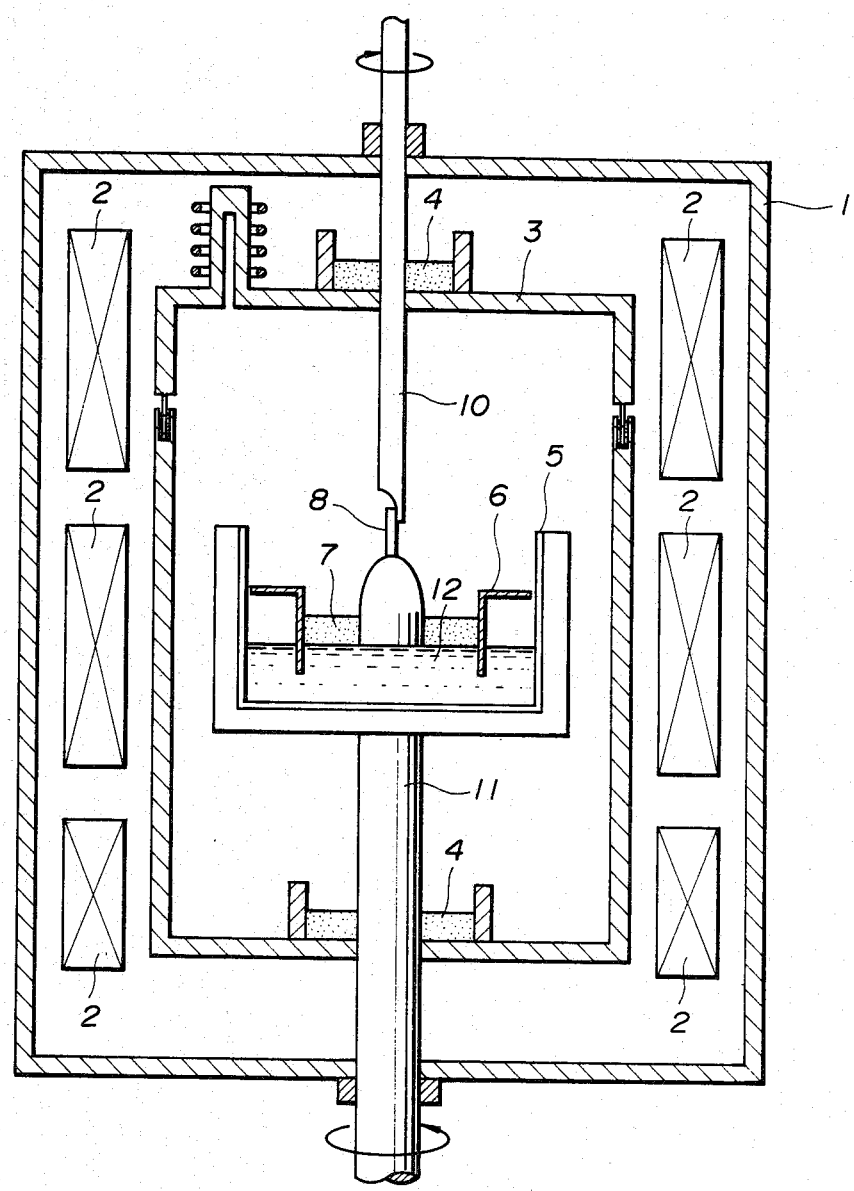
FIG. 1 shows a schematic cross-sectional view of an embodiment of an apparatus for carrying out the method of the present invention.

In the apparatus shown in FIG. 1, a growth chamber 3 for sealing a dissociative gas is so disposed in a metallic vessel 1 that it is surrounded by heaters 2. A pull shaft 10 having a single crystal seed 8 and a crucible 5, supported by a shaft 11 and containing GaAs melt 12 therein, are disposed in the growth chamber 3. A cylindrical partition pipe 6 having a flange is floated in a such manner that its lower end is immersed in the GaAs melt 12 and a $B_2O_3$ layer 7 covers the surface of the GaAs melt 12 in the inside of the partition pipe 6. The flange is provided in order to prevent the partition pipe 6 from moving or turning over and is so designed as to allow an arsenic gas to enter the melt 12.

The single crystal pull shaft 10 and the crucible supporting shaft 11 extend through the top and bottom walls of the metallic vessel 1 and the growth chamber 3, as shown in FIG. 1. Penetrating portions of the growth chamber 3 allowing both shafts 10 and 11 to pass therethrough are sealed with a $B_2O_3$ seal 4. The single crystal pull shaft 10 and the crucible supporting shaft 11 are so designed to rotate in opposite directions to each other, as shown by arrows.

Figure 2:
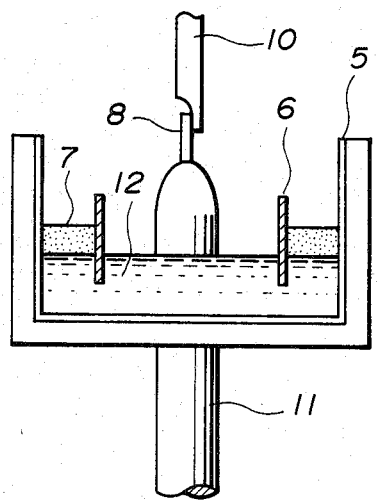
FIG. 2 is a cross-sectional view showing a modified way of covering GaAs melt surface with a $B_2O_3$ layer.
Figure 3:
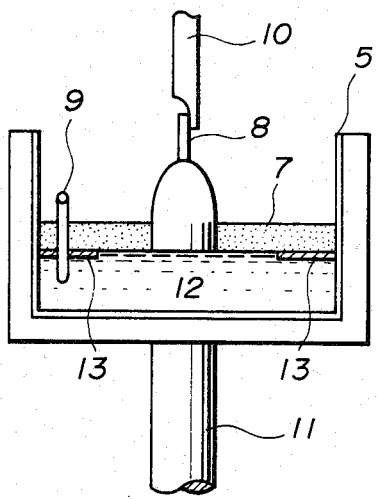
FIG. 3 is a sectional view showing another modified way of covering GaAs melt surface with a $B_2O_3$ layer.

FIGS. 2 and 3 are views illustrating other variants of the method of covering the surface of the GaAs melt 12 in the crucible 5 with the $B_2O_3$ layer 7. The variants shown in FIG. 2 is for covering the GaAs melt 12 with the $B_2O_3$ layer 7 in the area outside of the cylindrical partition pipe 6. In FIG. 3, a plate 13 which has a hole at its central portion and is made of the same material as the partition pipe 6 is disposed on the GaAs melt 12 and an arsenic gas inlet pipe 9 extends into the GaAs melt 12 through the plate 13. In such an arrangement, the most part of the GaAs melt 12 is covered with the $B_2O_3$ layer 7.

Preferably, the foregoing partition pipe 6 is positioned concentrically relative to the crucible 5 containing the melt 12 therein, but this is not critical. As shown by the As inlet pipe 9 in FIG. 3, the partition pipe (or cylinder) is not always required to be situated concentrically.

Although the quantity of the GaAs melt 12 is reduced as GaAs crystals are pulled up and the surface level of the melt 12 is also lowered, the surface of the GaAs melt 12 is not entirely sealed with the $B_2O_3$ layer 7, because the partition pipe 6 floating on the melt 12 is also lowered with lowering the surface. In other words, since the melt is, in part, open to an arsenic gas sealed in the growth chamber 3 throughout the crystal growth process, the arsenic gas can enter the melt through the un-sealed portion. Therefore, it is possible to properly control the composition of the melt 12 by regulating the pressure of an arsenic gas contained in the sealed growth chamber 3.

Further, the $B_2O_3$ layer 7 also effectively acts as a getter to deprive silicon from the melt 12 during the entire crystal growth process and, thus, any contamination problem due to silicon can be removed by controlling the quantity of the $B_2O_3$ layer 7. Still further, since, in the embodiments of the present invention shown in FIGS. 1 and 3, the $B_2O_3$ layer 7 is situated in contact with a growing crystal while retaining an uncoated portion for allowing arsenic gas to enter the melt 12, it is possible to avoid any detrimental effect due to the convection currents of arsenic gas in the vicinity of the solid-liquid interface of the growing crystal.

In such a manner, single crystals with a $<100>$ direction can be readily grown and thereby the desired round-shaped wafers with a $<100>$ direction can be produced in a high yield without requiring any complicated and extra procedure. Further, since the $B_2O_3$ layer 7 functions as an effective getter, high purity single crystals can be easily obtained. Further, the present invention enables the compositional control of the melt during the growing process, which has not been realized by any conventional LEC-type method, and whereby provides semi-insulating crystals having an excellent uniformity in resistivity.

Additionally, since the single crystal of the present invention is grown in an arsenic atmosphere, an unfavorable arsenic escape from the surface of the crystal can be easily prevented during the growing process even under a low temperature gradient. Further, it is possible to maintain the proper composition of GaAs and achieve the growth of crystals free from dislocations.

As described previously, the present invention eliminates disadvantages associated with the conventional LEC method while retaining the advantages of the method and makes possible the crystal growth of dissociative compounds, such as GaAs, with satisfactory properties for use in the substrates of high speed and/or optical devices.

Hereinafter, the present invention will be explained with reference to the detailed examples which follows.

EXAMPLE 1

In the apparatus shown in FIG. 1, the growth chamber 3 made of gas-tight ceramic was employed for sealing an arsenic gas and 500 gr. of Ga was charged into a PBN crucible 5. The cylindrical partition pipe 6 having a flange at the periphery thereof was concentrically mounted onto the crucible 5 in such an arrangement that a hole of the partition pipe 6 is positioned at the center of the crucible 5. $B_2O_3$ was placed inside the partition pipe 6 and 550 gr. of As was placed in some place in the growth chamber 3 away from the crucible 5. After the growth chamber 3 and the metallic vessel 1 were evacuated, the growth chamber 3 was sealed and then the PBN crucible 5 was heated to melt the charged Ga and $B_2O_3$. The $B_2O_3$ was melted inside the partition pipe 6 to form the $B_2O_3$ layer 7.

Then, the growth chamber 3 was heated to a temperature of at least 610° C. and an arsenic gas was brought into contact with Ga melt at the area in which the Ga melt was not covered with the $B_2O_3$ layer 7, whereupon As gas was absorbed into the Ga melt. Under such conditions, an arsenic pressure controlling furnace was heated at 618° C. and a single crystal seed 8 with a $<100>$ direction was brought down through the $B_2O_3$ layer 7 to bring it into contact with the GaAs melt. A single GaAs crystal was grown by pulling up. The dislocation density (the number of dislocations per unit area) of the single crystal was less than $500/cm^2$ and the crystal exhibited excellent semi-insulating properties.

EXAMPLE 2

In the embodiment shown in FIG. 2, the growth chamber 3 made of gas-tight ceramic was employed as in Example 1 and 800 gr. of Ga was placed in the PBN crucible 5. A carbon cylinder coated with PBN was disposed as the partition pipe 6 in the crucible 5 so that its hole was positioned at the center of the crucible 5. $B_2O_3$ was placed on the Ga surface in the outside of the partition pipe 6 and 900 gr. of As was placed in a location away from the crucible 5. A single GaAs crystal was pulled up in the same manner as Example 1.

The single crystal thus obtained has a dislocation density of $1000/cm^2$ and exhibited semi-insulating properties.

EXAMPLE 3

In another growing process, the growth chamber 3 made of gas-tight ceramic was employed as in Example 1 and 1000 gr. of Ga was charged in the PBN crucible 5. A carbon pipe coated with PBN was disposed as the arsenic gas inlet pipe 9 and $B_2O_3$ was placed, as shown in FIG. 3. The pipe 9 was fastened to the thin plate 13 having a hole at its central portion so as to stably float on the GaAs melt 12. 1100 gr. of As was placed in some appropriate place away from the crucible 5. A single GaAs crystal was pulled up in the same manner as Example 1.

The single crystal thus obtained had a dislocation density of $500/cm^2$ and exhibited excellent semi-insulating properties.

In the above described embodiments, only GaAs was taken as a representative of dissociative compounds, but the present invention is not limited to GaAs. The method of the present invention is also applicable to other dissociative compounds, for instance, arsenic compounds such as InAs, and phosphorus compounds such as InP or GaP with excellent results similar to those in the case of GaAs.

As previously described, the present invention readily provides single crystals of dissociative compounds, such as GaAs, exhibiting semi-insulating properties required as substrates of high speed and/or optical devices, in a high yield with a significantly reduced dislocation density.

Also, if needed, impurities can be doped, as in the case of the ordinary LEC method.

What is claimed is:

1. A method for growing a single crystal of a dissociative compound, comprising the steps of:
    pulling a single crystal of a dissociative compound upwardly from a central portion of an upper surface of a first melt of said dissociative compound in a crucible under the conditions that a first, central, fractional part of an area of said upper surface of said first melt is covered by and is in direct surface-to-surface contact with a second melt of $B_2O_3$ and said second melt surrounds and contacts the periphery of the single crystal that is being pulled from said first melt, a second, peripheral, functional part of the area of said upper surface of said first melt is free of direct contact with said second melt, the zone of said first melt below said second fractional part of the area of said upper surface is in contact with pressurized gas of a volatile component of said dissociative compound and the zone of said first melt that is below said second fractional part of said upper surface is in fluid flow communication with the zone of said first melt that is below said first fractional part of said upper surface.

2. A method according to claim 1, in which said dissociative compound is GaAs and said volatile component thereof is As.

3. A method for growing a single crystal of a dissociative semiconductor compound, comprising the steps of: in a sealed growth chamber, placing into a first melt of a dissociative semiconductor compound in a crucible the lower end of an annular partition pipe having a lower density than the density of said first melt so that said pipe projects above an upper surface of said first melt and isolates a first, central, fractional area of the upper surface of said first melt from a second, peripheral, fractional area thereof, the portions of said first melt below said first and second fractional areas being in fluid flow communication with each other below the upper surface of said first melt;
    covering said first fractional area with a layer of a second melt of $B_2O_3$ so that said second melt directly contacts and covers said central fractional area of said first melt and simultaneously maintaining said second fractional area uncovered by said second melt;
    exposing said second fractional area to direct contact with a pressurized ambient atmosphere containing a gas of a volatile component of said dissociative compound; and
    pulling a single crystal of said dissociative compound from said first melt through said second melt of $B_2O_3$ so that said second melt of $B_2O_3$ surrounds and contacts the periphery of the single crystal as it is pulled from said first melt.

4. A method of forming a single crystal of a dissociative compound, wherein said method comprises:
    providing a gas-tight chamber in which is disposed a melt of a dissociative compound;
    providing an atmosphere of a volatile component of said dissociative compound in contact with a first peripheral portion of an upper layer of said melt to facilitate control of the composition of said melt;
    sealing a central surface, portion of said upper layer of said melt from contact with said atmosphere within said chamber with a layer of molten $B_2O_3$ to reduce contamination of said melt and loss of volatile materials from said melt; and
    pulling a crystal from said second central portion of said melt through said layer of molten $B_2O_3$ so that said molten $B_2O_3$ surrounds and contacts the periphery of said single crystal as it is pulled from said melt.

5. A method of forming a single crystal of a dissociative compound as claimed in claim 4, wherein said sealing step comprises placing in said melt a cylindrical partition pipe capable of floating in said melt so as to define said first peripheral surface portion of said melt surrounding said partition pipe and said second central surface portion of said melt within said partition pipe, and wherein said layer of molten $B_2O_3$ is placed on said second central surface portion of said melt to seal said surface of said melt and to function as a getter of impurities in said melt.

6. A method of forming a single crystal of a dissociative compound as claimed in claim 5, wherein said layer of molten $B_2O_3$ is disposed within said partition pipe to seal said second central surface portion of the melt within the partition type from the atmosphere, said first peripheral surface portion of said melt being disposed outside said partition pipe, in communication with said atmosphere and the crystal is pulled from said second central surface portion of said melt within said pipe.

7. A method of forming a single crystal of a dissociative compound as claimed in claim 4, wherein said layer of $B_2O_3$ is placed on the surface of said second central portion of said melt, and an annular ring is placed on the surface of said first peripheral portion of said melt, said ring having an inlet pipe which is in communication with said atmosphere and said melt.

* * * * *

UNITED STATES PATENT AND TRADEMARK OFFICE
CERTIFICATE OF CORRECTION

PATENT NO. :  4,664,742
DATED     :  May 12, 1987
INVENTOR(S) :  Kenji Tomizawa et al It is certified that error appears in the above-identified patent and that said Letters Patent is hereby corrected as shown below:

Column 5, line 29; change "functional" to ---fractional---.
Column 6, line 46; change "type" to ---pipe---.

Signed and Sealed this

Eighth Day of September, 1987

Attest:

DONALD J. QUIGG

Attesting Officer

Commissioner of Patents and Trademarks